United States Patent [19]
Russell et al.

[11] Patent Number: 4,864,658
[45] Date of Patent: Sep. 12, 1989

[54] WRIST MOUNTED ENTERTAINMENT UNIT

[76] Inventors: Michael T. Russell; Chong S. Russell, both of 1355 High Site Dr. #110, Eagan, Minn. 55121

[21] Appl. No.: 213,629

[22] Filed: Jun. 30, 1988

[51] Int. Cl.⁴ ............................................. A41D 19/00
[52] U.S. Cl. ........................................ 2/160; 358/903; D14/131
[58] Field of Search ...................... 2/160, 159, 158, 16; 358/903, 254; D14/5, 21, 70, 79

[56] References Cited

U.S. PATENT DOCUMENTS

| | | |
|---|---|---|
| D. 229,509 | 12/1973 | Yanagisawa . |
| D. 266,502 | 10/1982 | Heijnen . |
| D. 278,232 | 4/1985 | Gaskins . |
| D. 279,095 | 6/1985 | Kato . |
| 3,189,073 | 6/1965 | Todd .................................. 2/160 X |
| 4,167,757 | 9/1979 | Kono . |
| 4,281,389 | 7/1981 | Smith ................................. 2/160 X |
| 4,635,516 | 1/1987 | Giannini ............................. 2/160 X |
| 4,761,835 | 8/1988 | Chen ......................................... 2/160 |
| 4,766,611 | 8/1988 | Kim ........................................... 2/160 |
| 4,768,681 | 9/1988 | Dean et al. ........................ 2/160 X |

Primary Examiner—H. Hampton Hunter
Attorney, Agent, or Firm—Leon Gilden

[57] ABSTRACT

A wrist mounted entertainment unit is set forth including a miniature television, calculator, radio, and clock combination wherein the aforenoted television is mounted in a first console separate and pivotally mounted to a second console housing the calculator, radio, and clock. The plural consoles are mounted upon an arcuate flexible mounting member with an underlying matrix of projections to space the consoles when mounted to an associated glove. The mounting enables circulation of air flow to protect the various electrical components from heat and damage associated therewith.

4 Claims, 3 Drawing Sheets

WRIST MOUNTED ENTERTAINMENT UNIT

BACKGROUND OF THE INVENTION

1. Field of the Invention

The field of invention relates to entertainment components, and more particularly pertains to a wrist mounted entertainment unit that is efficiently and effectively positioned and securable to an associated glove.

2. Description of the Prior Art

The use of entertainment units in various configurations is well known in the prior art. The advent of miniaturization of the various electrical components required in these units has enabled miniaturization to accommodate these units within ever decreasing sizes of chassis and cabinets.

Examples of prior art devices utilizing a combination of various components may be found in U.S. design Pat. 229,509 to Yanagisawa setting forth the use of a radio, tape player, clock and television within a single console.

Heijnen U.S. design Pat. 266,502 has enabled the use of a television, radio cassette recorder, and clock, again variously mounted about a console wherein patents of this category have set forth in principle the combination of various components without the accomodation of miniaturized circuitry associated therewith.

Gaskins U.S. design Pat. 278,232 is a further example of a video tape player and receiver, design patent 279,095 to Kato, et al., sets forth as television, radio, and tape recorder of conventional configuration and circuitry.

Kono U.S. Pat. No. 4,167,757 sets forth a television receiver formed with a cabinet and a circular opening wherein an enclosed television picture tube is rotatably mounted within a predetermined angular range relative the cabinet with an associated detent therefore to enable orientation of the cabinet in a variety of positions during use.

As such, it may be appreciated that there is a continuing need for a new and improved entertainment unit utilizing various components and positionable about a glove for ease of portage thereof.

SUMMARY OF THE INVENTION

In view of the foregoing disadvantages inherent in the known types of entertainment units now present in the prior art, the present invention provides a wrist mounted entertainment unit wherein the same may be compactly positioned with an included glove about a user's wrist when in use and may be further easily and efficiently removed from about a user and stored during periods of non-use. As such, the general purpose of the present invention, which will be described subsequently in greater detail, is to provide a new and improved wrist mounted entertainment unit which has all the advantages of the prior art entertainment units and none of the disadvantages.

To attain this, the present invention comprises a first and second arcuate mounting member pivotally mounted together with integral Velcro straps for securement about an associated glove to be worn by a user. The mounting units are formed with underlying projections in a matrix organization to position the entertainment unit and enable circulating air to be accommodated between the entertainment unit, the mounting portions, and the user to provide comfort to the user and air flow about the electrical components.

My invention resides not in any one of these features per se, but rather in the particular combination of all of them herein disclosed and claimed and it is distinguished from the prior art in this particular combination of all of its structures for the functions specified.

There has thus been outline, rather broadly, the more importnt features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved wrist mounted entertainment unit which has all the advantages of the prior art entertainment units and none of the disadvantages.

It is another object of the present invention to provide a new and improved wrist mounted entertainment unit which may be easily and efficiently manufactured and marketed.

It is a further object of the present invention to provide a new and improved wrist mounted entertainment unit which is of a durable and reliable construction.

An even further object of the present invention is to provide a new and improved wrist mounted entertainment unit which is susceptible of a low cost of manufacture with regard to both materials and labor, and which accordingly is then susceptible of low prices of sale to the consuming public, thereby making such wrist mounted entertainment units economically available to the buying public.

Still yet another object of the present invention is to provide a new and improved wrist mounted entertainment unit which provides in the apparatuses and methods of the prior art some of the advantages thereof, while simultaneously overcoming some of the disadvantages normally associated therewith.

Still another object of the present invention is to provide a new and improved wrist mounted entertainment unit removably mounted to a support means wherein the support means is configured and arranged to enable enhanced air circulation between a user and the entertainment unit as well as the mounting unit.

These together with other objects of the invention, along with the various features of novelty which characterize the invention, art pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
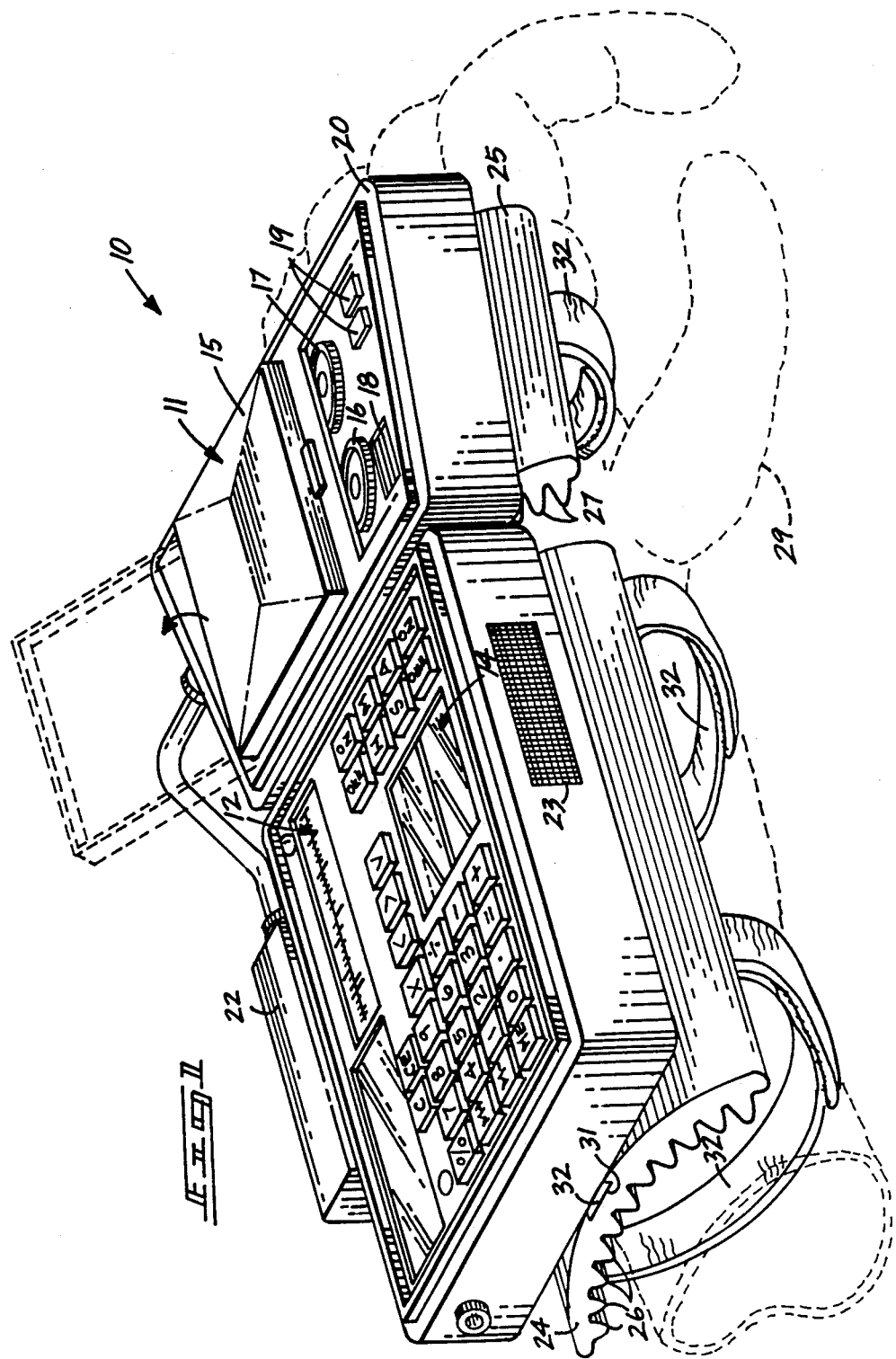
FIG. 1 is an isometric illustration of the instant invention.
Figure 2:
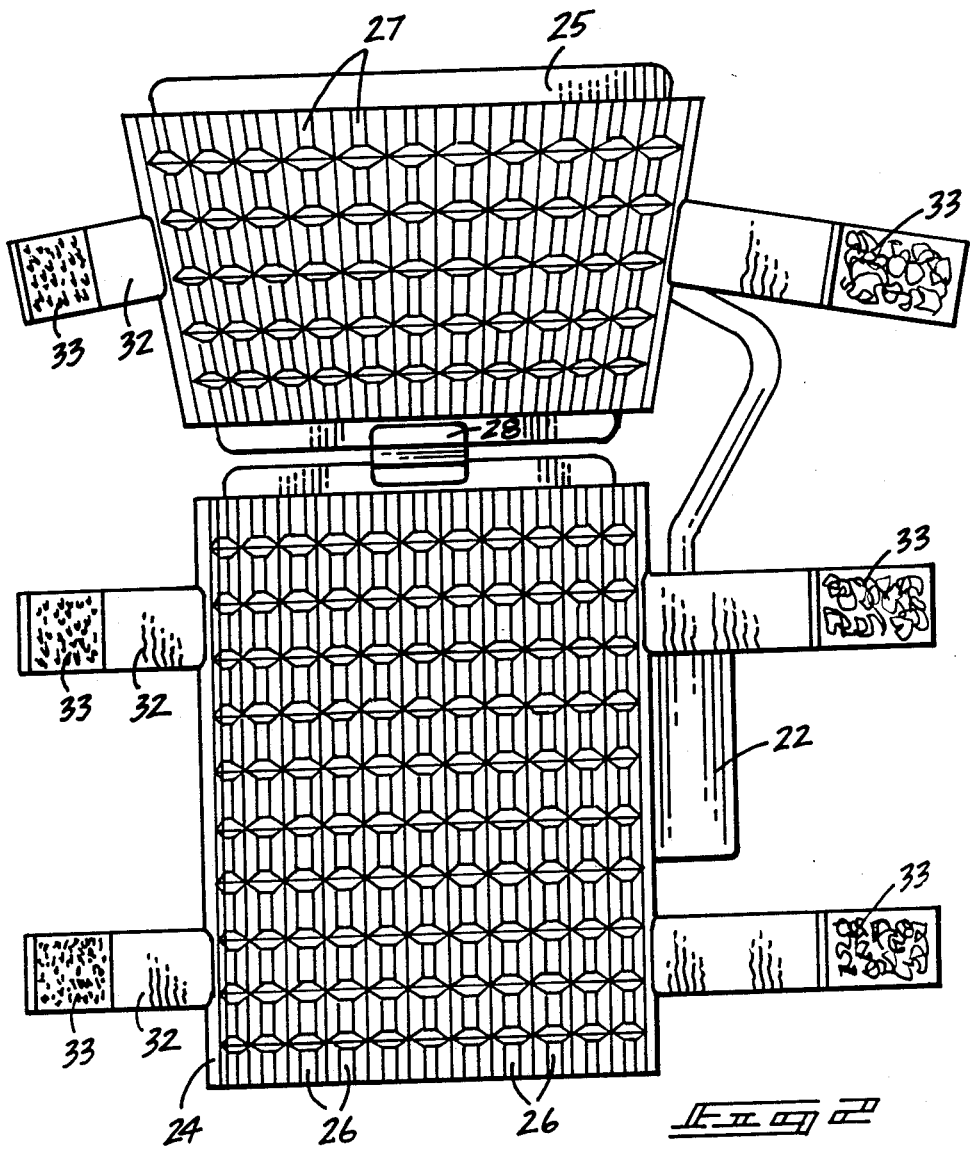
FIG. 2 is a bottom orthographic view of the instant invention.
Figure 3:
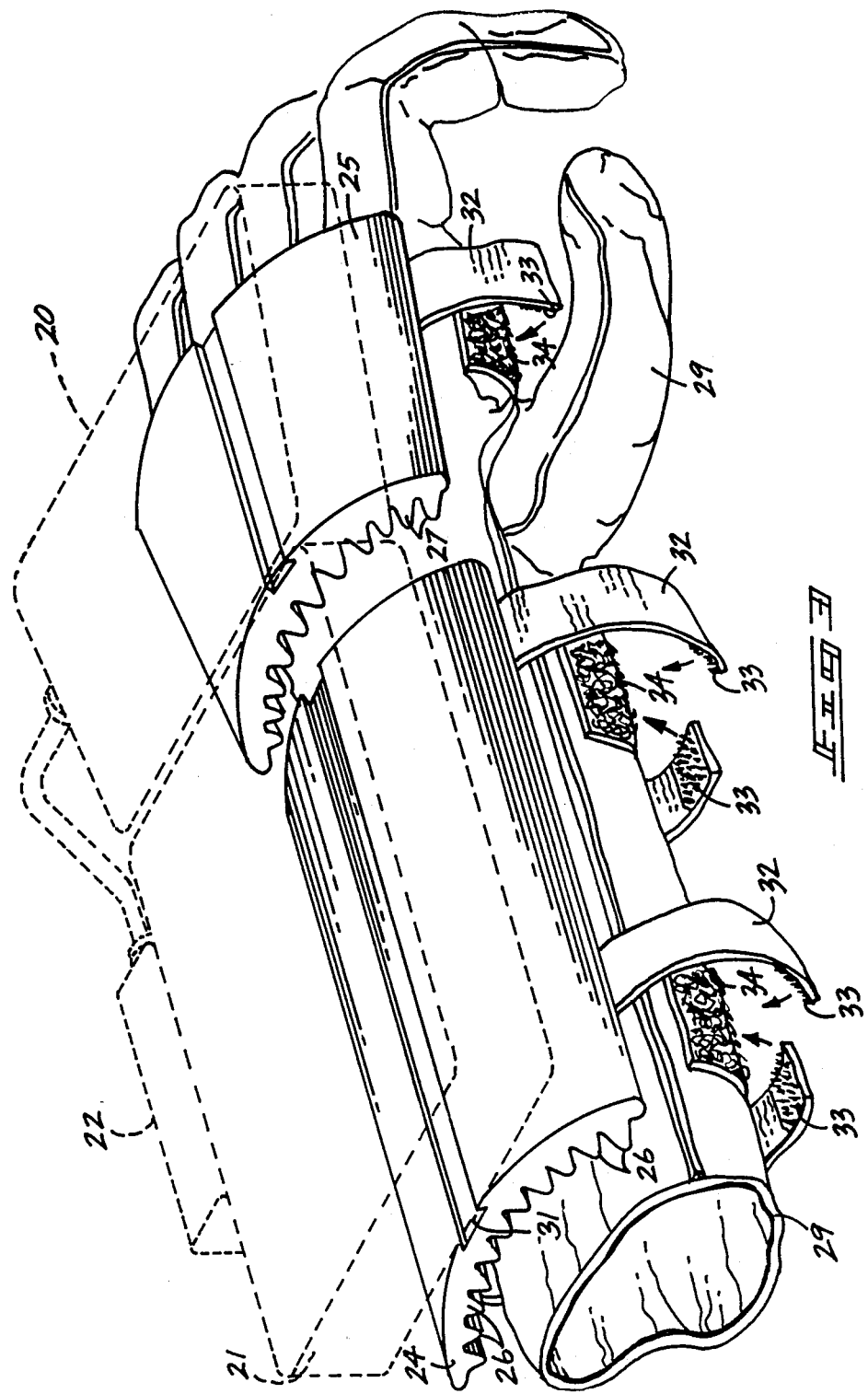
FIG. 3 is an isometric view of the instant invention illustrating the mounting of the entertainment unit to an associated glove to be worn by a user.

With reference now to the drawings, and in particular to FIGS. 1 to 3 thereof, a new and improved wrist mounted entertainment unit embodying the principles and concepts of the present invention and generally designated by the reference numeral 10 will be described.

More specifically, it will be noted that the wrist mounted entertainment unit 10 essentially comprises a miniaturized video receiver 11, radio receiver 12, calculator 13, and clock 14 of contemporary construction. The individual electrical components are available commercially through normal manufacturing outlets.

The video receiver 11 is formed with a pivotally mounted protective cover 15 and with conventional volume and tuning controls 16 and 17 and speaker 18. On/off buttons 19 are provided for the selective use of the video receiver.

The video receiver is mounted individually within a forward cabinet 20 wherein a rear cabinet 21 of rectangular parallelpipet construction is mounted rearwardly thereof. It may be appreciated that the forward cabinet 20 is formed of a generally trapezoidal configuration to take advantage of the greater width associated with the back of a user's hand and accordingly accommodate the somewhat larger video receiver construction.

The rear cabinet 21 has formed thereto a storage battery power supply 22 to provide power to the forward and rear cabinet components. Mounted onto a vertical surface of rear cabinet 21 is a speaker 23 for providing audio transmission associated with the radio receiver 12 and its associated controls. The calculator 13 is to conventional construction and configuration, as is the digital clock 14 which may contain its own power supply apart from that provided by the power supply 22.

The effectiveness and longevity of the entertainment unit 10 is provided by its mounting wherein the forward cabinet 20 is mounted to a forward mount 25 and rear cabinet 21 mounted to a rear mount 24. The mounts 24 and 25 are formed of flexible rubber-like material to accommodate a variety of contours associated with the human anatomy, particularly the forearm and hand configurations.

The mounts 24 and 25 are formed with faces provided with a matrix of projections 26. The projections 26 are of trapezoidal cross-sectional configuration to provide a relatively comfortable and blunt mounting contact surface and simultaneously enable air circulation about the numerous matrix of projections 26 to provide comfort to a user and minimize heat build up within a mounting surface on a user that may impose unwanted heat to the various electrical components within the cabinets 20 and 21.

A pivot interconnection 28, as illustrated in FIG. 2, interconnects the forward and rear mounts 25 and 24 to enable accommodation of flexure between a user's forearm and hand, as the rear and forward mounts 24 and 25 are secured about an associated glove 29. The glove 29 is formed with Velcro connectors 34 to cooperate with companion Velcro connectors 33 on the associated straps 32 wherein a plural pair of straps 32 are utilized to secure the rear mount 24 with a single pair of straps 32 to secure the forward mount 25. The Velcro interconnections 33 and 34 are formed on surfaces to enable accommodation of the mounts 24 and 25 about a myriad of positions on the glove 29 in accommodation of varying physical contours of users.

The rear and forward cabinets 20 are formed with projecting tongues 30, as illustrated in FIG. 1, that are slidably secured within complementary grooves 31 to enable removal of the forward and rearward cabinets 20 and 21 from the mounts for ease of storage and enabling sanitizing and cleaning of the mounts 24 and 25 after prolonged usage thereof.

It may be appreciated therefore that the unique mounting arrangement of the cabinets 20 and 21 enables the convenient usage of the entertainment unit with an associated glove by a variety of users for prolonged periods of time.

The manner of usage of and operation therefore of the instant invention should be apparent from the above description. Accordingly, no further discussion relative to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompasssed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by LETTERS PATENT of the United States is as follows:

1. A wrist mounted entertainment unit comprising a forward cabinet containing a video receiver and a rear cabinet containing a calculator, a radio receiver, and a clock; and said forward cabinet including first means removably securing the forward cabinet to a forward mount and said rear cabinet including a second means removably securing the rear cabinet to a rear mount, and said forward and rear mounts including third means detachably securing said mounts to a glove to conform to a hand and forearm portion of a human anatomy, and wherein said forward and rear mounts are formed of arcuate flexible rubber-like material to accommodate variations in human forearm and hand anatomy, and wherein the first means of said forward cabinet is slidably secured to said forward mount and includes a tongue fixedly secured to said forward cabinet and slidably received within a complementary groove within said forward mount and wherein the second means of said rear cabinet is slidably received within said rear mount and includes a tongue fixedly secured to said rear cabinet and received within a complementary groove formed in said rear mount.

2. A wrist mounted entertainment unit as set forth in claim 1 wherein said forward and rear mounts are formed with a surface engaged about said glove and each surface formed with a matrix of projections wherein said projections are of trapezoidal cross-sectional configuration to enable air circulation between said projections.

3. A wrist mounted entertainment unit as set forth in claim 2 wherein said forward and rearward mounts are pivotally secured together by a flexible interconnection.

4. A wrist mounted entertainment unit as set forth in claim 3 wherein said rear mount has fixedly secured thereto a plurality of strap pairs and said forward mount has a single strap pair fixedly secured thereto wherein said strap pairs define said third means and are formed with hook and loop connections cooperative with companion hook and loop connections formed on said glove whereby said forward and rear mounts are removable from said glove and said forward and rear cabinets are removable from said forward and rear mounts respectively to enable sanitizing of the mounts and glove subsequent to prolonged usage.

* * * * *